US012652783B2

(12) United States Patent
Tian et al.

(10) Patent No.: US 12,652,783 B2
(45) Date of Patent: Jun. 9, 2026

(54) RACK HEAT EXCHANGER TO REDUCE ROOM-LEVEL DATACENTER HEAT LOAD

(71) Applicant: International Business Machines Corporation, Armonk, NY (US)

(72) Inventors: Shurong Tian, Mount Kisco, NY (US); Todd Edward Takken, Brewster, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 252 days.

(21) Appl. No.: 18/520,899

(22) Filed: Nov. 28, 2023

(65) Prior Publication Data

US 2025/0176146 A1 May 29, 2025

(51) Int. Cl.
*H05K 7/20* (2006.01)

(52) U.S. Cl.
CPC ..... *H05K 7/20727* (2013.01); *H05K 7/20745* (2013.01); *H05K 7/20781* (2013.01)

(58) Field of Classification Search
None
See application file for complete search history.

(56) References Cited

U.S. PATENT DOCUMENTS

| | | | |
|---|---|---|---|
| 6,785,142 B1 * | 8/2004 | Regimbal | H05K 7/1498 174/16.3 |
| 7,804,687 B2 | 9/2010 | Copeland | |
| 8,009,430 B2 | 8/2011 | Claassen | |
| 8,456,840 B1 | 6/2013 | Clidaras | |
| 9,125,326 B1 | 9/2015 | Eichelberg | |
| 9,476,649 B2 | 10/2016 | Reytblat et al. | |
| 10,334,763 B2 | 6/2019 | Gao | |
| 10,455,744 B2 * | 10/2019 | Grinberg | H05K 7/20572 |
| 10,888,029 B2 | 1/2021 | Jochim | |
| 2009/0009958 A1 | 1/2009 | Pflueger | |
| 2021/0274688 A1 * | 9/2021 | Rajput | F24F 11/88 |
| 2024/0023269 A1 * | 1/2024 | Tunks | H05K 7/20745 |

FOREIGN PATENT DOCUMENTS

EP            1810558 B1      4/2013

* cited by examiner

*Primary Examiner* — Mukundbhai G Patel
(74) *Attorney, Agent, or Firm* — Tihon Poltavets

(57) ABSTRACT

An in-rack cooling system is disclosed. The cooling system includes one or more computer drawers, one or more open areas in the rack, a heat exchanger, and one or more fans in the open areas of the rack. The open areas are areas within the rack where computer drawers could be installed, but are not. The fans direct air exhausted from the computer drawers through the heat exchanger. Further the air flowing through the heat exchanged flows through the heat exchanger in a first airflow direction when flowing from the computer drawers and a second airflow direction when flowing through the open areas.

20 Claims, 9 Drawing Sheets

RACK HEAT EXCHANGER TO REDUCE ROOM-LEVEL DATACENTER HEAT LOAD

BACKGROUND

The present invention relates to cooling computing systems, and more specifically, to cooling rack computing systems through the use of heat exchangers.

As server power increases it is becoming more common to use rear door air-to-liquid heat exchangers to cool the hot air which exits from the compute racks that house the servers. The rear door heat exchanger operates optimally when cooling a heat load that is distributed evenly throughout the rack. Further server power increases will lead designers to partial populate racks, leading to an unevenly distributed heat load. A section of rear door heat exchanger in series with populated high-power servers may not remove all server heat, while a section of rear door heat exchanger with no servers will remain unused.

SUMMARY

Embodiments of the present disclosure are directed to a system for cooling a computing system in a rack. The system includes at least one air mover component disposed in a portion of the rack not having electronic computing equipment installed. The system further includes an air-to-liquid heat exchanger to remove heat from air passing along parallel path to air traveling through the electronic computing components. The heat exchanger can be located on a rear door of the rack, within the interior space of the rack, or in space above the rack.

Embodiments of the present disclosure are directed to an in-rack cooling system. The system includes one or more computer drawers, one or more open areas in the rack, a heat exchanger, and one or more fans in the open areas of the rack. The open areas are areas within the rack where computer drawers could be installed, but are not. The fans direct air exhausted from the computer drawers through the heat exchanger. Further the air flowing through the heat exchanged flows through the heat exchanger in a first airflow direction when flowing from the computer drawers and a second airflow direction when flowing through the open areas

Figure 1:
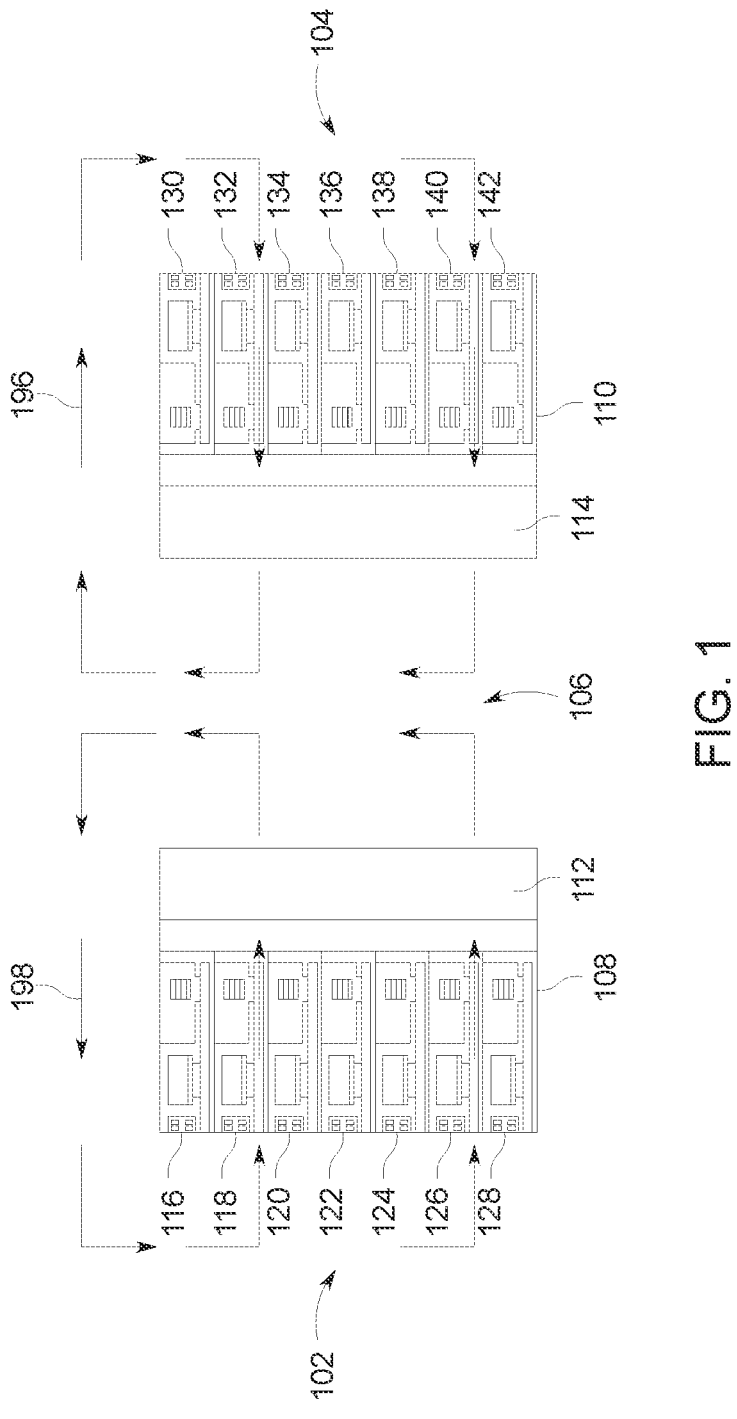
FIG. 1 is a side view that illustrates the compute racks fully populated with low power servers according to embodiments of the present disclosure.

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to cooling computing systems, more particular aspects relate to cooling rack computing systems through the use of heat exchangers where portions of the rack are not full. While the present disclosure is not necessarily limited to such applications, various aspects of the disclosure may be appreciated through a discussion of various examples using this context.

Embodiments of the disclosure enables a rear door heat exchanger to maximize the cooling capacities for partially populated high-power severs in the rack. The disclosure also enables unpopulated cooling sections of a compute rack to comprise an entire rack.

Figure 2:
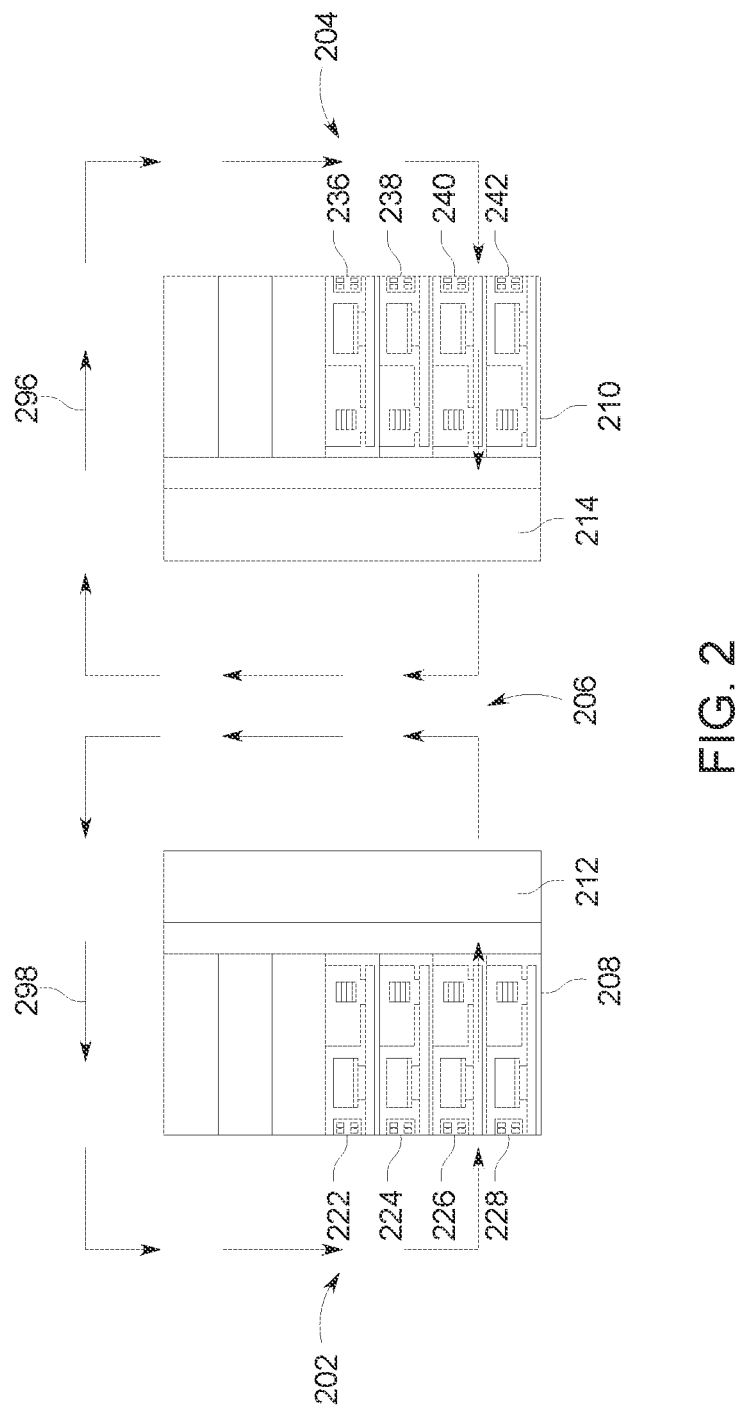
FIG. 2 is a side view that illustrates the compute racks partially populated with high-power servers according to embodiments of the present disclosure.

FIGS. 1 and 2 are side views of two compute racks arranged back to back. FIG. 1 illustrates the compute racks fully populated with low power servers. Low power servers are servers that are designed to consume less electrical power and generate less heat than traditional servers. They are commonly found in areas such as data centers, cloud computing infrastructure, edge computing environments.

In FIG. 1 the rear door heat exchanges 112, 114 provide cooling. Rear door heat exchangers, also known as rear door cooling units or rear door heat exchanger (RDHx) systems, are a type of cooling solution used in data centers to efficiently manage and dissipate heat generated by server racks. These systems are typically mounted on the rear doors of server cabinets and provide a supplementary cooling mechanism to help maintain an optimal operating temperature for the servers and networking equipment.

Rear door heat exchangers are installed on the rear doors of server cabinets. These are essentially large, closed units that replace the standard rear doors of the server cabinets. The heat exchanger units are designed to fit various cabinet sizes and can be retrofitted onto existing server racks. Server racks typically draw in cool air from the front and expel hot air from the rear. The rear door heat exchanger takes advantage of this already existing airflow pattern. As such hot air exhausted from the servers passes through the rear door heat exchanger.

As the air passes through the heat exchanger unit it flows past coils or a set of heat transfer plates. These components interact with the hot air from the servers. The coils or plates transfer the heat from the air to a cooling medium, such as a liquid coolant that circulates through the heat exchanger. This coolant is typically water or a glycol-water mixture. This liquid is kept at a lower temperature than the hot air from the servers. As heat is transferred to the coolant, the server exhaust air is cooled down. The cooling liquid circulates through a closed loop system, with a pump ensuring a continuous flow. As the coolant absorbs heat from the server exhaust air, it becomes warmer and is routed to a cooling unit. The cooling unit is typically located outside of the data center room. The unit dissipates heat into the ambient environment using various cooling methods, such as air-to-air or air-to-water heat exchangers, or even direct expansion refrigeration systems. The cooled down liquid is then recirculated During operation, air flows from the cold aisle 102 and 104 to the compute racks 108 and 110 through the computer drawers 116, 118, 120, 122, 124, 126, 128, 130, 132, 134, 136, 138, 140, 142 to the rear door heat exchanger 112 and 114. It should be noted that the number of computer drawers present in the rack can vary depending on the size of the rack and the size of the computer drawers. The computer drawers 116, 118, 120, 122, 124, 126, 128, 130, 132, 134, 136, 138, 140, 142 include one or more air mover components (not illustrated separately) within them configured to move the air through the computer drawers. The hot air is transferred from the electronic components in each of the computer drawers to the air and is then cooled back down to the room temperature through the rear door heat exchanger. Arrows 196 and 298 represents the direction of the airflow.

FIG. 2 illustrates the compute racks partially populated with high-power servers. High power servers or enterprise-class servers, are engineered for tasks that require significant computing power, memory, and storage capacity. These servers are characterized by their ability to handle intensive workloads, such as large-scale data processing, database management, virtualization, artificial intelligence, scientific simulations, etc. While these servers offer exceptional performance, they also tend to consume more electrical power and generate more heat than low-power servers, so proper cooling and power management are essential in their deployment.

Due to the placement of the high power servers in the compute rack, some sections of rear door heat exchangers provide little cooling as little to no hot air is passing through those portions . . . . In general, the rear door heat exchanger is designed based on the total power generation per rack assuming uniform power distributions. Inserting a partially high-power server to utilize the existing rear door heat exchanger attached to rack has some benefits. Similar to FIG. 1 the air flow follows a similar path. The air flows from the cold aisles 202 and 204 to the racks 208 and 210 through the computer drawers 222, 224, 226, 228, 236, 238, 240, 242 to the rear door heat exchangers 212 and 214, then to the room. However, the hot air transferred from the electronic components in the computer drawer to the air will not be cooled back down to the room temperature through the rear door heat exchanger. A room level air cooling CRAC unit may be needed to cool the air back down to the room temperature. The arrows 296 and 298 represents the airflow flow directions.

Figure 3:
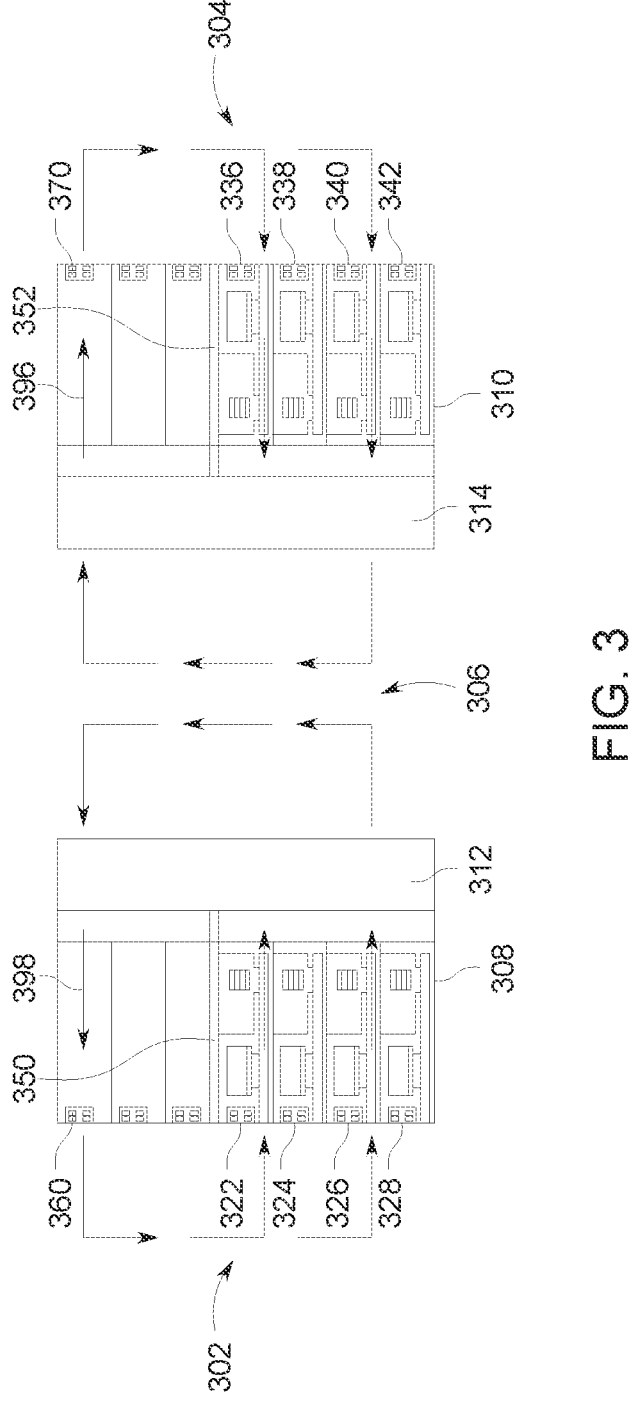
FIG. 3 is a side view of two compute racks according to embodiments of the present disclosure.

FIG. 3 is a side view of two compute racks according to embodiments of the present disclosure. FIG. 3 illustrates an approach that allows more of the rear door heat exchangers to assist in providing cooling in a partially full compute rack. This approach allows sections of compute rack that are not populated with servers (or other equipment) and sections of rear door heat exchangers that are not adjacent to servers (or other equipment) to provide cooling using an antiparallel airflow approach. To achieve this additional cooling one or more exhaust fans or blowers 360 and 370 are added to the compute rack 308, 310. Through the use of the fans 360, 370, the air which was previously not fully cooled back down the to room temperature is then pulled back following arrows 396 and 398 to the rear door heat exchangers 312 and 314. The air is then further cooled such that the air returning to the rack through the cold aisle s302 and 304 is maintained at room temperature. Similar to FIG. 1 and FIG. 2, the air flows from the cold aisles 302 and 304 to the computer racks 308 and 310 through the computer drawers 322, 324, 326, 328, 336, 338, 340, 342 to the rear door heat exchangers 312 and 314. However, the air then flows back to the rear door heat exchangers 312 and 314 through areas in which there are no computer drawers. Air blocker 350 and 352 can be provided to prevent the recirculation of the air into the areas where there are servers or other components.

Figure 4:
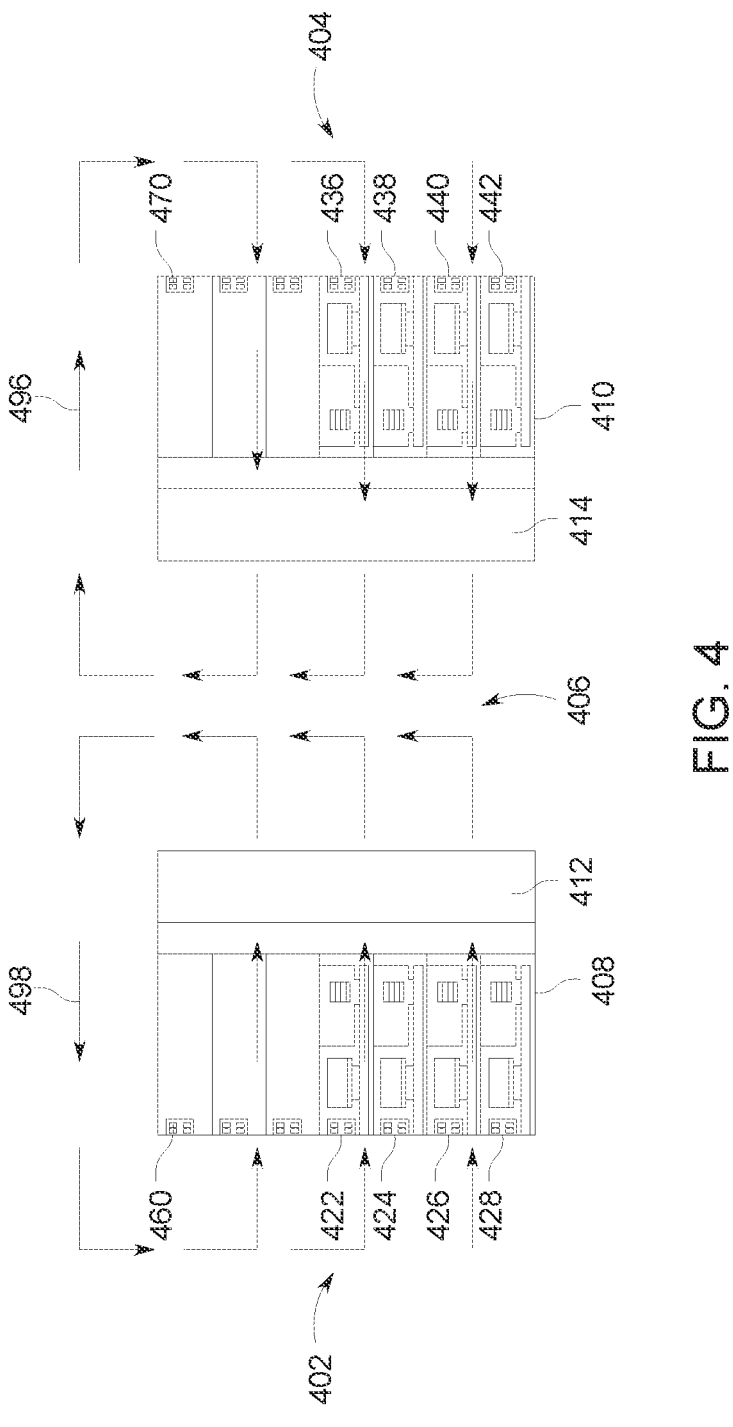
FIG. 4 is a side view of two compute racks according to embodiments of the present disclosure.

FIG. 4 is a side view of two compute racks according to embodiments of the present disclosure. FIG. 4 illustrates an approach that allows one or more of the rear door heat exchanges to assist in providing cooling in a partially full computer rack. This approach allows sections of rack that are not populated with servers (or other equipment) and sections of rear door heat exchangers that are not adjacent to servers (or other equipment) to provide cooling using a parallel airflow approach. To achieve this additional cooling one or more intake fans or blowers 460 and 470 are added the compute rack 408, 410. Through the use of the fans 460, 470, the air that was not fully cooled back down the to room temperature is blown back following arrows 496 and 498 towards the rear door heat exchangers 412 and 414. The air is then further cooled so that the air re-enters to the rack through the cold aisles 302 and 304 at room temperature. Similar to FIG. 1 and FIG. 2, the air flows from the cold aisles 402 and 404 to the compute racks 408 and 410 through the computer drawers 422, 424, 426, 428, 436, 438, 440, 442 to the rear door heat exchangers 412 and 414. However, the air then flows back to the rear door heat exchanger 412 and 414 from the top of the rack to the areas which no computer drawers are present. In this approach there is no advantage in providing air blockers such as in FIG. 3.

Figure 5:
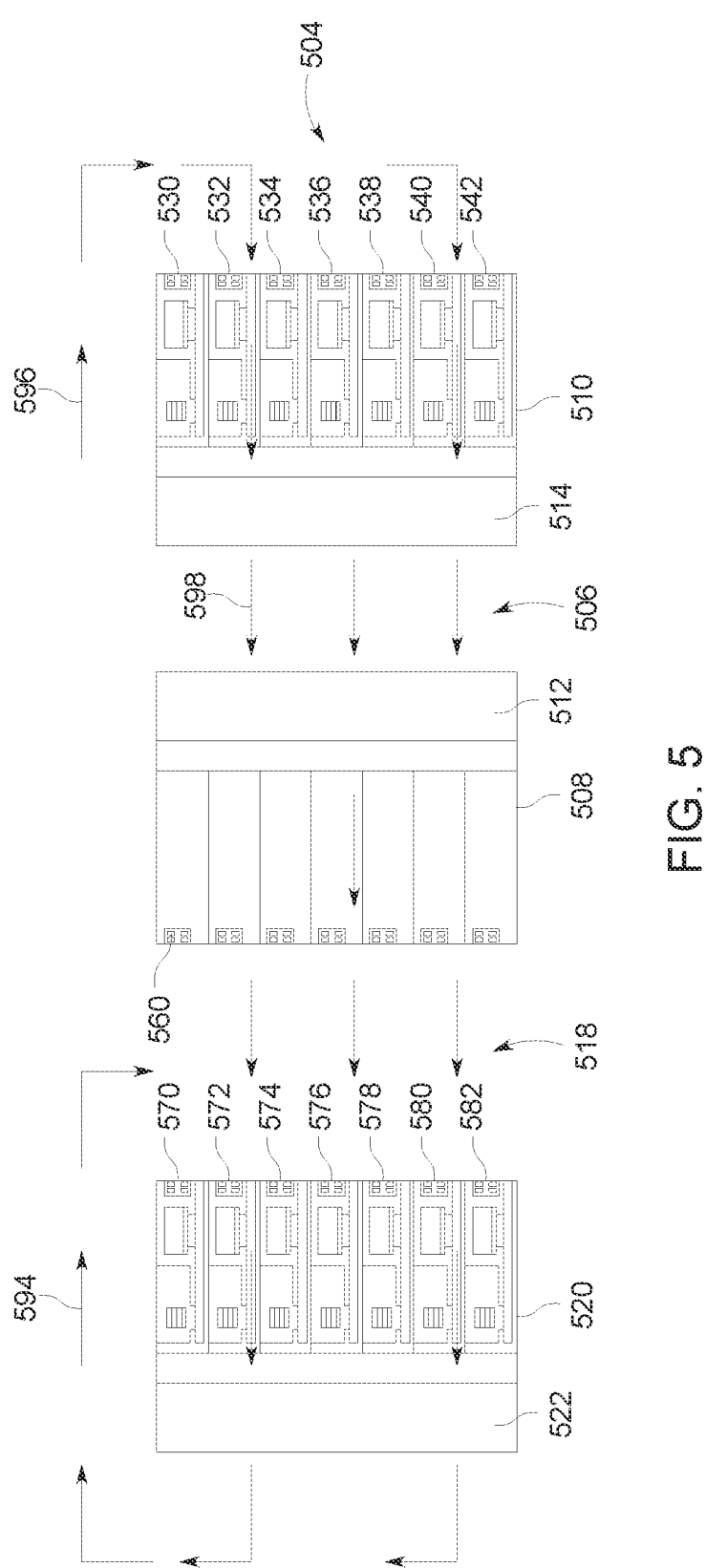
FIG. 5 is a side view of three different compute racks employing the enhanced cooling system according to embodiments of the present disclosure.
Figure 6:
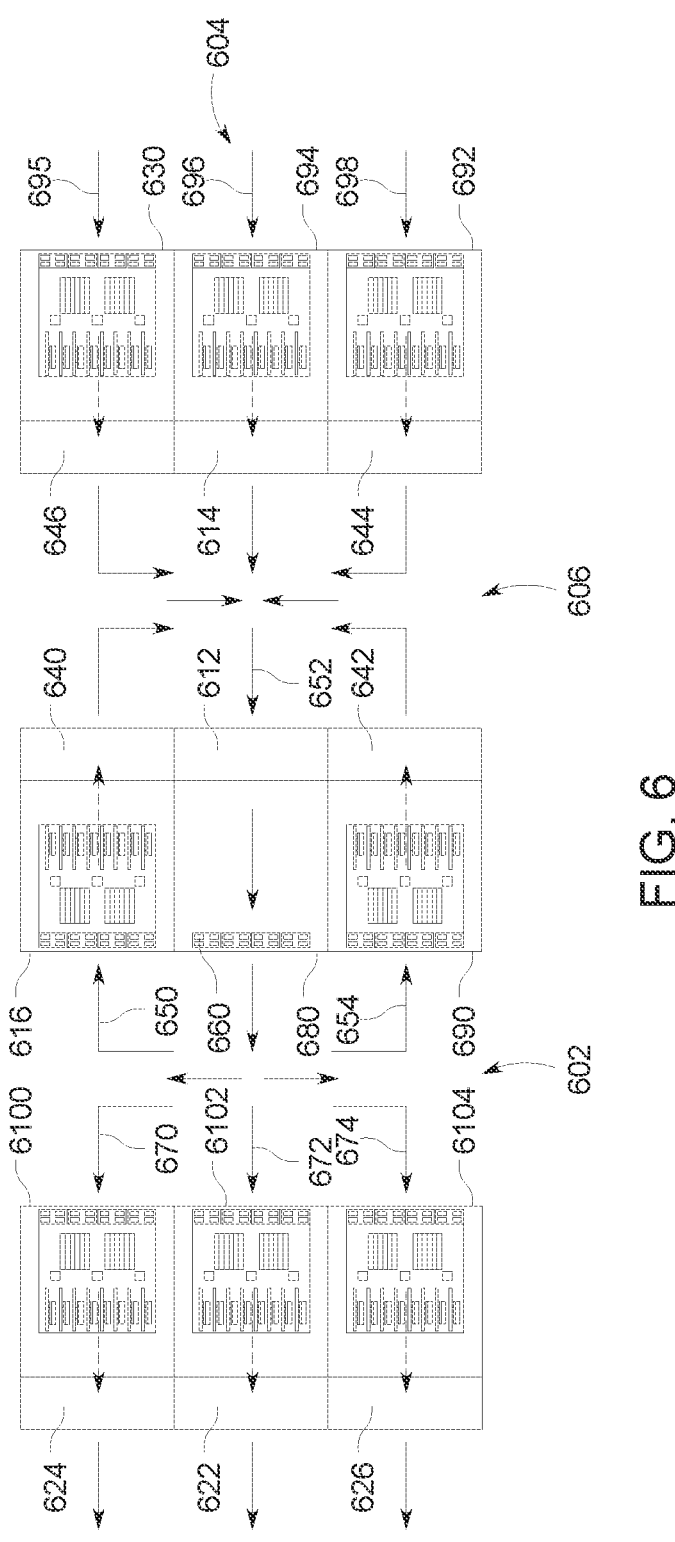
FIG. 6 is a top down view of a number of compute racks arranged according to embodiments of the present disclosure.

FIG. 5 is a side view of three different compute racks employing the enhanced cooling system according to embodiments of the present disclosure. In FIG. 5 two of the compute racks 510 and 520 are illustrated as full. Compute rack 508 is illustrated as an empty rack disposed between racks 510 and 520. Racks 510 and 520 can include computer drawers 530, 532, 534, 536, 538, 540, 542, 570, 572, 574, 576, 578, 580, and 582. While rack 508 is illustrated as empty, it should be recognized that rack 508 can in some embodiments be partially full. Further, rack 508 need not be the middle rack, but could be one of the outer ones. Additionally, there need not be 3 racks present, but any number of racks can be present either in a line as illustrated in FIG. 5 or in rows as illustrated in FIG. 6. In FIG. 5 exhaust fans or blowers 560 are added to the unpopulated areas of the compute rack 508. The corresponding rear door heat exchanger 512 in rack 508 is able to provide additional cooling for the room that would otherwise not be possible. The direction that the fans 560 blow or suck can be determined based on the arrangement of the compute racks and the location of the rear door heat exchange relative to the desired airflow direction. In FIG. 5 the airflow follows the directions shown by the arrows 594, 596 and 598. Elements 504, 518 represent the cold aisles, while element 506 represents the hot aisle.

FIG. 6 is a top down view of a number of compute racks arranged according to embodiments of the present disclosure. Similar to FIG. 5, FIG. 6 includes at least one compute rack 680 that is not a full rack, and in this case is a completely empty rack. As in FIG. 5 exhaust fans or blowers 660 are added to the compute rack 680. With these fans 660, the rear door heat exchanger 612 in rack 680 are able to provide more cooling for the room. The airflow flows from cold aisle 604 for the left compute racks 630, 692, and 694 following the directions shown by arrows 695, 696, 698 to each rack on the left. At the hot aisle 606, most of the air that exhausted from the compute racks 630, 692, and 694 flows through the unpopulated rack rear door heat exchanger 612 following the direction of arrow 652 through the fans or blower 660 of rack 680. The air then is then distributed to the compute racks 616, 654, 6100, 6102, 6104 following the directions of arrows 650, 654, 670, 672, 674, respectively.

Figure 7:
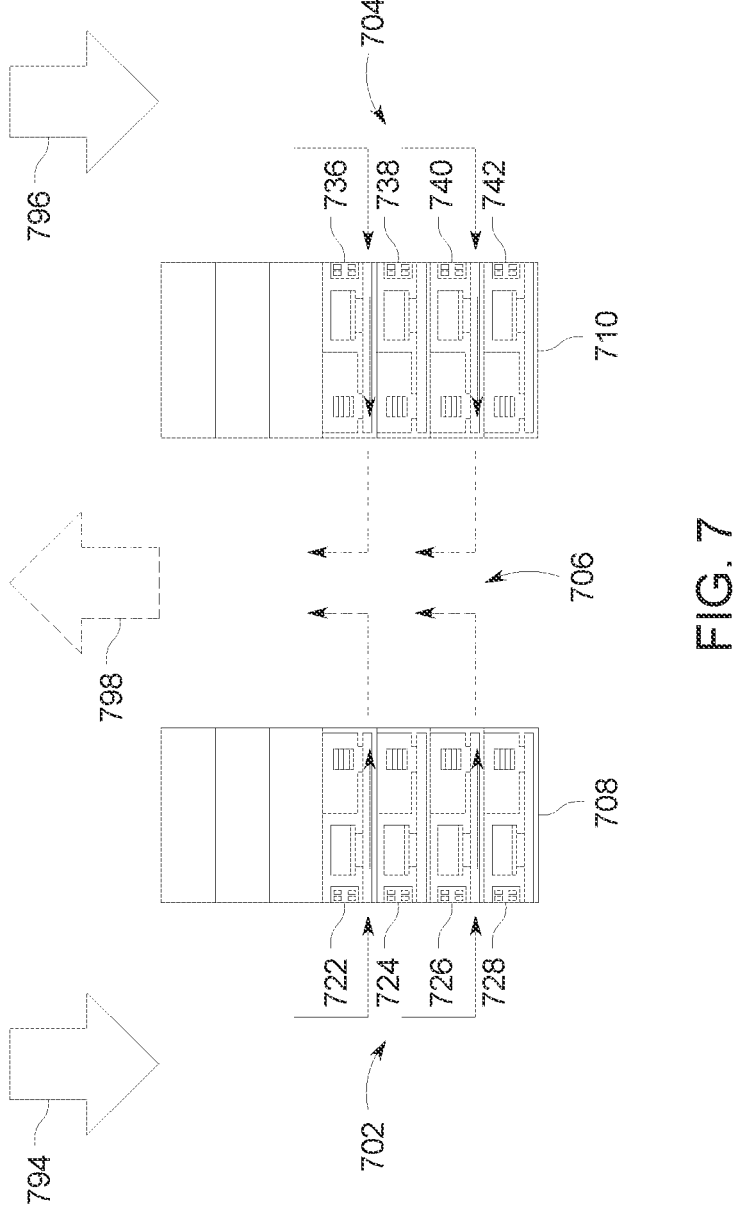
FIG. 7 is a side view of two compute racks without rear door heat exchangers according to embodiments.

FIG. 7 is a side view of two compute racks 708, 710 without rear door heat exchangers according to embodiments. As there are no rear doors the component needs to be cooled using other methods. In some embodiments a room level computer room air conditioning (CRAC) unit (not illustrated) is provided to provide this cooling. A CRAC is a device that monitors and maintains the temperature, air distribution and humidity in a data center, network or server room. The CRAC unit is used in order to cool the hot air back down. The cold air from the CRAC enters the cold aisles 702 and 704 following the direction of arrows 794 and 796 to the compute racks 708 and 710. The air flows to the compute drawers 722, 724, 726 and 728 from the cold aisle 702 exhausting the hot air to the hot aisle 706. The air flows to the computer drawer 736, 738, 740 and 742 from the cold aisle 704 exhausting the hot air to the hot aisle 706. The hot air then follows the direction of arrow 798 to the room CRAC unit to be cooled down.

Figure 8:
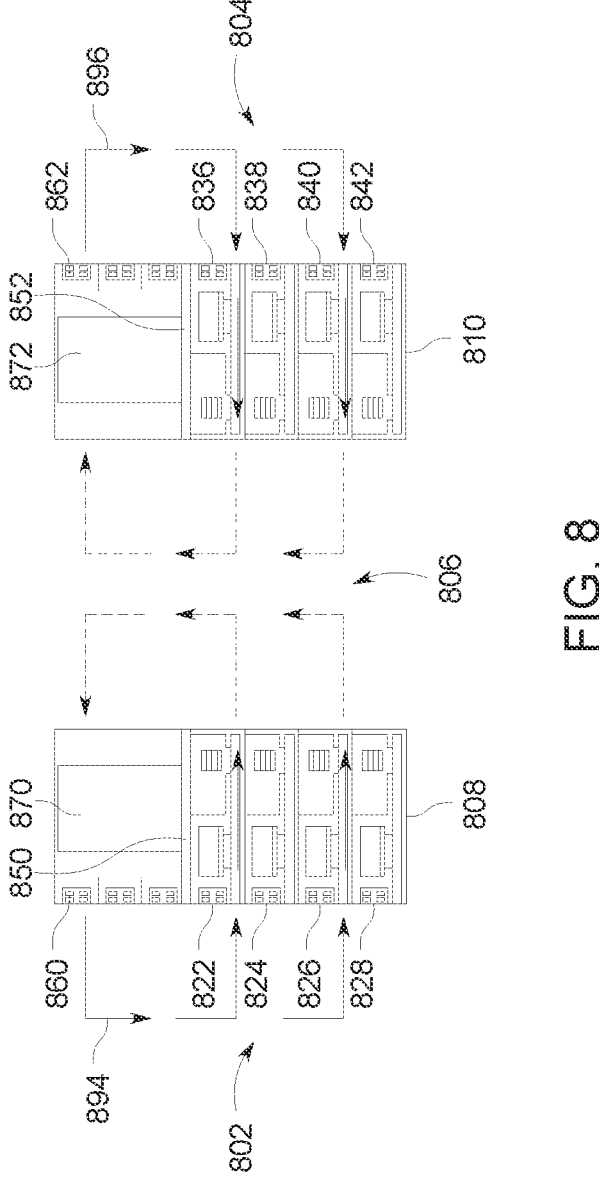
FIG. 8 is a side view of two compute racks according to embodiments of the present disclosure.

FIG. 8 is a side view of two compute racks 808 and 810 according to embodiments of the present disclosure. In FIG. 8 the portions of the racks 808 and 810 that are not populated with servers or other equipment have an air-to-liquid heat exchanger 870, 872 added within the form facto of the rack. That is that the heat exchangers 870 and 872 are placed inside the corresponding rack and occupy space that would otherwise have been empty. Further, e exhaust fans or blowers 860 and 862 are added the racks 808 and 810. The hot air from the compute drawers 822, 824, 826, 828, 836, 838, 840 and 842 in racks 808 and 810 is exhausted into the hot aisle 806 can be cooled back down using the heat exchangers 870 and 872 without having to rely on the air traveling back to the CRAC. To help prevent the air being cooled from interacting with the air being used to cool the compute drawers 822, 824, 826, 828, 836, 838, 840 and 842, optional air blocks 850 and 852 can be inserted into the rack 808 and 810, respectively.

Figure 9:
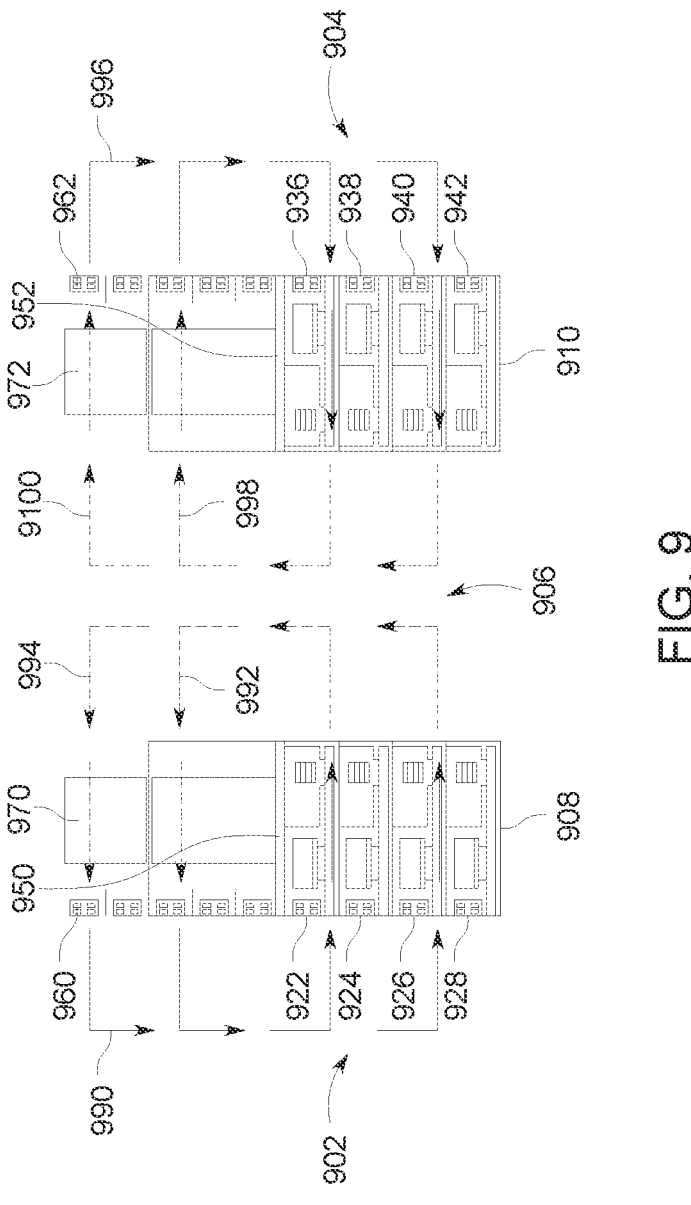
FIG. 9 is a side view of two compute racks according to embodiments of the present disclosure.

FIG. 9 is a side view of two compute racks 908 and 910 according to embodiments of the present disclosure. In FIG. 9 the portions of the racks 908 and 910 that are not populated with servers or other equipment have an air-to-liquid heat exchanger 970, 972 added within the form facto of the rack. However, in the embodiment illustrated in FIG. 9 the heat exchanges 970, 971 further extend beyond the form factor of the rack 908, 910. That is the heat exchangers 970 and 972 extend beyond the top frame of the rack 908 and 910 Similar to FIG. 8, by adding the exhaust fans or blowers 960 and 962, the hot air from the hot air from the rack 908, 910 compute drawers 922, 924, 926, 928, 936, 938, 940 and 942 in the racks 908, 910 is exhausted into the hot aisle 906 can be cooled back down through the heat exchanger 970 and 972 . . . . The heat exchangers 970 and 972 can be one or more heat exchangers. The air flows through the extended heat exchanger will follow the according to arrows 990, 992, 994, 996, 998 and 9100. To help prevent the air being cooled from interacting with the air being used to cool the compute drawers 922, 924, 926, 928, 936, 938, 940 and 942, optional air blocks 950 and 952 can be inserted into the rack 808 and 810, respectively.

The present disclosure can be considered as well in view of the following examples.

Example 1 is a system for cooling a computing system in a rack. The computing system includes at lease one air mover component disposed in a portion of the rack not having electronic computing equipment installed; and an air-to-liquid heat exchanger configured to remove heat from air passing along a first airflow path that is parallel to a second airflow path that removes heat from electronic computing components.

Example 2 includes the computing system of example 1, including or excluding optional features. In this example, a vector direction of flow in coordinate space of the first and second airflow paths are similar.

Example 3 includes the computing system of any one of examples 1 to 2, including or excluding optional features. In this example, a vector direction of flow in coordinate space of the first and second airflow paths are in opposite directions.

Example 4 includes the computing system of any one of examples 1 to 3, including or excluding optional features. In this example, both the air mover and the air-to-liquid heat exchanger that remove heat from the first airflow path are located in an interior of the rack.

Example 5 includes the computing system of any one of examples 1 to 4, including or excluding optional features. In this example, both the air mover and the air-to-liquid heat exchanger that remove heat from the first airflow path are located on an exterior of the rack in a door assembly.

Example 6 includes the computing system of any one of examples 1 to 5, including or excluding optional features. In this example, the air mover that removes heat from the first airflow path is located in an interior or the rack, and wherein the air-to-liquid heat exchanger that remove heat from the first airflow path is located on an exterior of the rack in a door assembly. Optionally, the air-to-liquid heat exchanger assembly is a single door on the rack.

Example 7 includes the computing system of any one of examples 1 to 6, including or excluding optional features. In this example, at least a portion of the air mover and the air-to-liquid heat exchanger located external to the rack and is attached to the rack. Optionally, the computing system includes an air blocker configured to separate the first airflow path from the second airflow path within the rack.

Example 8 includes the computing system of any one of examples 1 to 7, including or excluding optional features. In this example, the second airflow path and the electronic computing components are located in a different rack from the first airflow path and the air mover and air-to-liquid heat exchanger.

Example 9 is an in rack cooling system. The system includes one or more computer drawers disposed within the rack; one or more open areas within the rack, the open areas comprising space within the rack where additional computer drawers could be installed; a heat exchanger on rack, the heat exchanger configured to remove heat from air as the air flows past the heat exchanger; one or more fans disposed within the open areas of the rack, the one or more fans configured to direct air exhausted from the one or more computer drawers through the heat exchanger; and wherein air flowing through the heat exchanged flows through the heat exchanger in a first airflow direction when flowing from the computer drawers and a second airflow direction when flowing through the open areas.

Example 10 includes the system of example 9, including or excluding optional features. In this example, the first direction and the second direction of air flow are the same direction.

Example 11 includes the system of any one of examples 9 to 10, including or excluding optional features. In this example, the first direction and the second direction of air flow are in opposite directions. Optionally, the system includes an air blocker configured to block air flowing through the open areas from interacting with air flowing through the computer drawers.

Example 12 includes the system of any one of examples 9 to 11, including or excluding optional features. In this example, the fans and the heat exchanger are disposed within a form factor of the rack and in the open areas of the rack.

Example 13 includes the system of any one of examples 9 to 12, including or excluding optional features. In this example, at least one or more of the fans and at least a portion of the heat exchanger are disposed on an external portion of the rack.

Example 14 includes the system of any one of examples 9 to 13, including or excluding optional features. In this example, the heat exchanger is a rear door heat exchanger.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for cooling a computing system in a rack comprising:
a first portion of the rack and a second portion of the rack;
a first air mover component and an air-to-liquid heat exchanger disposed in the first portion of the rack not having electronic computing equipment installed, wherein a first airflow path passes through the air-to-liquid heat exchanger towards the first air mover component; and
a second air mover component disposed in the second portion of the rack having electronic computing components, wherein a second airflow path passes through the second air mover component towards the electronic computing components, wherein the first airflow path is in an opposite direction to the second airflow path.

2. The system of claim 1, further comprising:
an air blocker located between the first portion of the rack and the second portion separating the first airflow path and the second airflow path.

3. The system of claim 1, wherein the first air mover component and the second air mover component are located on a first side of the rack.

4. The system of claim 1, wherein the first portion of the rack is located above the second portion of the rack.

5. The system of claim 1, wherein the air-to-liquid heat exchanger extends beyond a top frame of the rack.

6. The system of claim 5, further comprising:
a third air mover component located external to the rack opposite a portion of the air-to-liquid heat exchanger that extends beyond the top frame of the rack.

7. The system of claim 6, wherein a third airflow path passes through the portion of the air-to-liquid heat exchanger that extends beyond the top frame of the rack towards the third air mover component.

8. The system of claim 7, wherein the third airflow path is in a direction similar to the first airflow path.

9. The system of claim 1, further comprising:
a third air mover component located on another rack, wherein a third airflow path passes through the third air mover component towards other electronic computing components on the another rack, wherein the third airflow path is opposite the second airflow path.

10. The system of claim 1, further comprising:
a third air mover component located on another rack, wherein a third airflow path passes through another air-to-liquid heat exchanger on the another rack towards the third air mover component, wherein the third airflow path is opposite the first airflow path.

11. An in rack cooling system comprising:
a first portion of a rack and a second portion of the rack;
one or more open areas within the first portion of the rack;
one or more computer drawers disposed within the second portion of the rack;
a heat exchanger disposed within the first portion of the rack, the heat exchanger configured to remove heat from a first airflow path as air flows past the heat exchanger; and
a first fan disposed within the second portion of the rack, the first fan is configured to direct a second airflow path exhausted from the one or more computer drawers, wherein the first airflow path is in an opposite direction to the second airflow path.

12. The in rack cooling system of claim 11, further comprising:
an air blocker located between the first portion of the rack and the second portion separating the first airflow path and the second airflow path.

13. The in rack cooling system of claim 11, further comprising:
a second fan configured to direct the first airflow path through the heat exchanger;
wherein the first fan and the second fan are located on a first side of the rack.

14. The in rack cooling system of claim 11, wherein the first portion of the rack is located above the second portion of the rack.

15. The in rack cooling system of claim 11, wherein the heat exchanger extends beyond a top frame of the rack.

16. The in rack cooling system of claim 15, further comprising:
a third fan located external to the rack opposite a portion of the heat exchanger that extends beyond the top frame of the rack.

17. The in rack cooling system of claim 16, wherein a third airflow path passes through the portion of the heat exchanger that extends beyond the top frame of the rack towards the third fan.

18. The in rack cooling system of claim 17, wherein the third airflow path is in a direction similar to the first airflow path.

19. The in rack cooling system of claim 11, further comprising:
a third fan located on another rack, wherein a third airflow path passes through the third fan towards other electronic computing components on the another rack, wherein the third airflow path is opposite the second airflow path.

20. The in rack cooling system of claim 11, further comprising:

a third fan located on another rack, wherein a third airflow path passes through another heat exchanger on the another rack towards the third fan, wherein the third airflow path is opposite the first airflow path.

\* \* \* \* \*